United States Patent
Sandhu

(10) Patent No.: US 9,129,848 B2
(45) Date of Patent: Sep. 8, 2015

(54) METHOD AND STRUCTURE FOR INTEGRATING CAPACITOR-LESS MEMORY CELL WITH LOGIC

(71) Applicant: Micron Technology, Inc., Boise, ID (US)

(72) Inventor: Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/048,249

(22) Filed: Oct. 8, 2013

(65) Prior Publication Data

US 2014/0038367 A1 Feb. 6, 2014

Related U.S. Application Data

(60) Continuation of application No. 13/610,053, filed on Sep. 11, 2012, now Pat. No. 8,704,286, which is a division of application No. 12/338,404, filed on Dec. 18, 2008, now Pat. No. 8,278,167.

(51) Int. Cl.
*H01L 21/8238* (2006.01)
*H01L 27/108* (2006.01)
*H01L 21/84* (2006.01)
(Continued)

(52) U.S. Cl.
CPC .......... *H01L 27/10844* (2013.01); *H01L 21/84* (2013.01); *H01L 27/105* (2013.01); *H01L 27/10802* (2013.01); *H01L 27/10894* (2013.01);
(Continued)

(58) Field of Classification Search
CPC ............ H01L 27/115; H01L 27/11526; H01L 27/11521; H01L 27/105; H01L 21/28273; H01L 21/84; H01L 27/10844; H01L 27/10894; H01L 27/10897; H01L 27/1203; H01L 27/10802; H01L 27/0688; H01L 27/108; H01L 29/7841; H01L 27/1052; H01L 29/1608; H01L 29/792; H01L 29/785; G11C 2211/4016; G11C 11/404

USPC ......................................................... 438/201

See application file for complete search history.

(56) References Cited

U.S. PATENT DOCUMENTS 5,719,079 A 2/1998 Yoo et al.
5,798,965 A 8/1998 Jun
(Continued)

FOREIGN PATENT DOCUMENTS

CN 1604306 4/2005
CN 101064333 10/2007
(Continued)

OTHER PUBLICATIONS

Fazan et al., A Simple 1-Transistor Capacitor-Less Memory Cell for High Performance Embedded DRAMs, IEEE Custom Integrated Circuits Conference, 2002, pp. 99-102.
(Continued)

*Primary Examiner* — Michelle Mandala
(74) *Attorney, Agent, or Firm* — Wells St. John, P.S.

(57) ABSTRACT

Methods for fabricating integrated circuits include fabricating a logic device on a substrate, forming an intermediate semiconductor substrate on a surface of the logic device, and fabricating a capacitor-less memory cell on the intermediate semiconductor substrate. Integrated circuits with capacitor-less memory cells formed on a surface of a logic device are also disclosed, as are multi-core microprocessors including such integrated circuits.

29 Claims, 7 Drawing Sheets

(51) Int. Cl.
*H01L 27/105* (2006.01)
*H01L 27/12* (2006.01)
*H01L 27/06* (2006.01)

(52) U.S. Cl.
CPC ...... *H01L 27/10897* (2013.01); *H01L 27/1203* (2013.01); *H01L 27/0688* (2013.01)

(56) References Cited

U.S. PATENT DOCUMENTS

| | | | |
|---|---|---|---|
| 6,097,036 | A | 8/2000 | Teshima et al. |
| 6,117,725 | A | 9/2000 | Huang |
| 6,180,496 | B1 | 1/2001 | Farrens et al. |
| 6,297,090 | B1 | 10/2001 | Kim |
| 6,303,468 | B1 | 10/2001 | Aspar et al. |
| 6,335,258 | B1 | 1/2002 | Aspar et al. |
| 6,353,269 | B1 | 3/2002 | Huang |
| 6,372,609 | B1 | 4/2002 | Aga et al. |
| 6,573,604 | B1 | 6/2003 | Kajita |
| 6,737,316 | B2 | 5/2004 | Lee |
| 6,737,332 | B1 | 5/2004 | Fuselier et al. |
| 6,756,286 | B1 | 6/2004 | Moriceau et al. |
| 6,772,992 | B1 * | 8/2004 | Lombardo et al. ............ 257/315 |
| 6,809,044 | B1 | 10/2004 | Aspar et al. |
| 6,821,826 | B1 | 11/2004 | Chan et al. |
| 6,846,703 | B2 | 1/2005 | Shimoda et al. |
| 7,064,378 | B2 | 6/2006 | Shau |
| 7,119,365 | B2 | 10/2006 | Takafuji et al. |
| RE39,484 | E | 2/2007 | Bruel |
| 7,321,148 | B2 | 1/2008 | Blalock et al. |
| 7,605,429 | B2 | 10/2009 | Bernstein et al. |
| 7,629,233 | B2 | 12/2009 | Bernstein et al. |
| 7,858,972 | B2 | 12/2010 | Tokunaga et al. |
| 7,947,528 | B2 | 5/2011 | Iwabuchi et al. |
| 7,973,314 | B2 | 7/2011 | Yang et al. |
| 8,049,293 | B2 | 11/2011 | Iwabuchi et al. |
| 8,101,466 | B2 | 1/2012 | Yamazaki et al. |
| 8,309,392 | B2 | 11/2012 | Iwabuchi et al. |
| 8,440,499 | B2 | 5/2013 | Iwabuchi et al. |
| 2003/0057423 | A1 | 3/2003 | Shimoda et al. |
| 2003/0213994 | A1 | 11/2003 | Hayashi et al. |
| 2004/0137686 | A1 | 7/2004 | Chen et al. |
| 2004/0219761 | A1 | 11/2004 | Fuselier et al. |
| 2005/0067620 | A1 | 3/2005 | Chan et al. |
| 2006/0099776 | A1 | 5/2006 | Dupont |
| 2006/0197007 | A1 | 9/2006 | Iwabuchi et al. |
| 2006/0231893 | A1 | 10/2006 | Bernstein et al. |
| 2006/0275962 | A1 | 12/2006 | Lee |
| 2007/0045738 | A1 | 3/2007 | Jones et al. |
| 2007/0057307 | A1 | 3/2007 | Shum et al. |
| 2007/0215906 | A1 | 9/2007 | Wu et al. |
| 2008/0009114 | A1 | 1/2008 | Bernstein et al. |
| 2008/0061346 | A1 | 3/2008 | Tang et al. |
| 2008/0137394 | A1 | 6/2008 | Shimano et al. |
| 2008/0157162 | A1 | 7/2008 | Doyle et al. |
| 2008/0165601 | A1 | 7/2008 | Matick et al. |
| 2008/0203403 | A1 | 8/2008 | Kawahara et al. |
| 2008/0230838 | A1 | 9/2008 | Ohara |
| 2008/0237779 | A1 | 10/2008 | Yamazaki et al. |
| 2008/0283873 | A1 | 11/2008 | Yang et al. |
| 2008/0308802 | A1 | 12/2008 | Honda |
| 2009/0057539 | A1 | 3/2009 | Iwabuchi et al. |
| 2009/0065681 | A1 | 3/2009 | Iwabuchi et al. |
| 2010/0264474 | A1 | 10/2010 | Iwabuchi et al. |
| 2010/0267185 | A1 | 10/2010 | Iwabuchi et al. |
| 2010/0276572 | A1 | 11/2010 | Iwabuchi et al. |
| 2011/0012200 | A1 | 1/2011 | Allibert et al. |
| 2011/0156111 | A1 | 6/2011 | Iwabuchi et al. |
| 2011/0188329 | A1 | 8/2011 | Kawahara et al. |
| 2012/0098086 | A1 | 4/2012 | Yamazaki et al. |

FOREIGN PATENT DOCUMENTS

| | | |
|---|---|---|
| CN | 200980150820.6 | 7/2013 |
| CN | 200980150820.6 | 2/2015 |
| JP | H11-251518 | 9/1999 |
| JP | 2004-265975 | 9/2004 |
| JP | 2007-141958 | 6/2007 |
| JP | 2008-205322 | 9/2008 |
| JP | 2008-226904 | 9/2008 |
| JP | 2008-536335 | 9/2008 |
| JP | 2008-270771 | 11/2008 |
| KR | 1998-021103 | 6/1998 |
| KR | 10-0268419 | 7/2000 |
| KR | 10-2004-0102052 | 12/2004 |
| KR | 20080036209 | 4/2008 |
| KR | 2008-0100649 | 11/2008 |
| TW | 098143402 | 6/2013 |
| WO | WO 2007/024433 A2 | 3/2007 |
| WO | WO 2006/129762 | 12/2008 |
| WO | PCT/US2009/066951 | 6/2010 |

OTHER PUBLICATIONS

Morishita et al., A Capacitorless Twin-Transistor Random Access memory (DRAM) on SOI, IEEE Custom Integrated Circuits Conference, Sep. 18-21, 2005, pp. 435-438.

Wann et al, A Capacitorless DRAM Celion SOI Substrate, Department of Electrical Engineering and Computer Sciences, University of California at Berkeley, Dec. 5-8, 1993, pp. 635-638.

* cited by examiner

METHOD AND STRUCTURE FOR INTEGRATING CAPACITOR-LESS MEMORY CELL WITH LOGIC

This patent resulted from a continuation application of U.S. patent application Ser. No. 13/610,053, filed Sep. 11, 2012, entitled "Method And Structure For Integrating Capacitor-less Memory Cell With Logic", naming Gurtej S. Sandhu as inventor, which is a divisional application of U.S. patent application Ser. No. 12/338,404, filed Dec. 18, 2008, now U.S. Pat. No. 8,278,167 B2, entitled "Method And Structure For Integrating Capacitor-less Memory Cell With Logic", naming Gurtej S. Sandhu as inventor, the disclosures of which is hereby incorporated by reference.

TECHNICAL FIELD

The present invention, in various embodiments, relates generally to methods for fabricating memory cells and logic devices on a common substrate. More specifically, embodiments of the present invention include a fabrication method in which a logic device is formed on an active surface of a substrate, a semiconductor material is formed over the logic device, and a so-called "capacitor-less" memory cell is formed on the semiconductor material. In addition, embodiments of the present invention comprise integrated circuits with at least one capacitor-less memory cell situated above a logic device, as well as multi-level arrays of memory cells situated above a substrate comprising logic.

BACKGROUND

Higher performance, lower cost, increased miniaturization of components, and greater packaging density of semiconductor devices are ongoing goals of the electronics industry. Two significant classifications of semiconductor devices are logic and memory. Logic devices are used, in combinations conventionally termed microprocessors, primarily to process information. Memory devices, on the other hand, are used for information storage. Conventionally, while these two device types are found in virtually all electronic systems, such as computers and the like, they have been manufactured on separate integrated circuits and connected only at the card or board level. This has been due to differences in manufacturing processes, cost considerations, economies of scale, and other difficulties in fabricating the different device structures on a common substrate.

Trends in the semiconductor industry have led to making it more desirable and feasible to blend memory and logic on the same integrated circuit. Typically, in such structures a memory cell and a logic device are formed side-by-side in a single plane on a common substrate. Such integrated circuits are described in detail in, for example, U.S. Pat. No. 5,719,079 to Yoo et al. which is entitled Method of Making a Semiconductor Device Having High Density 4T SRAM in Logic with Salicide Process, U.S. Pat. No. 6,353,269 to Huang which is entitled Method for Making Cost-Effective Embedded DRAM Structures Compatible with Logic Circuit processing, U.S. Pat. No. 6,573,604 to Kajita which is entitled Semiconductor Device Carrying Memory and Logic Circuit on a Chip and Method of Manufacturing the Same, and U.S. Patent Application Publication No. 2008/0157162 to Doyle which is entitled Method of Combining Floating Body Cell and Logic Transistors, the disclosures of each of which document is incorporated herein in its entirety by this reference.

There are several drawbacks to these integrated circuits with memory and logic positioned side-by-side on the same substrate. For example, state-of-the-art multi-core microprocessors may have 4 or 16 processors on a single substrate. Each processor requires that a significant portion of the area, or "real estate" on the active surface of the substrate be occupied by associated memory, consequently requiring a larger than desirable semiconductor substrate or, stated another way, an undesirably low number of processors on a given size substrate. Additionally, there may be structural limitations for arranging the various processors on the substrate so that each processor has adequate access to memory without unnecessarily consuming real estate or utilizing undesirable signal lengths. Furthermore, while SRAM is conventionally the memory integrated with logic devices, SRAM structure does not provide good circuit density due to the number of required components per cell. The SRAM fabrication process is compatible with that of logic devices; however, the overall process flow is inefficient.

In addition, conventional fabrication techniques which might otherwise be used to combine memory with logic are impractical, due to the high temperatures utilized in forming memory on a substrate already comprising logic and metallization associated therewith.

Accordingly, there are needs for processes in which memories and logic can be formed on a common substrate while minimizing the amount of active area on the substrate needed and maintaining efficiency of and accessibility to memory by the logic.

BRIEF DESCRIPTION OF THE DRAWINGS

In the drawings, in which various features of embodiments of the present invention are depicted.

DETAILED DESCRIPTION

Figure 1:
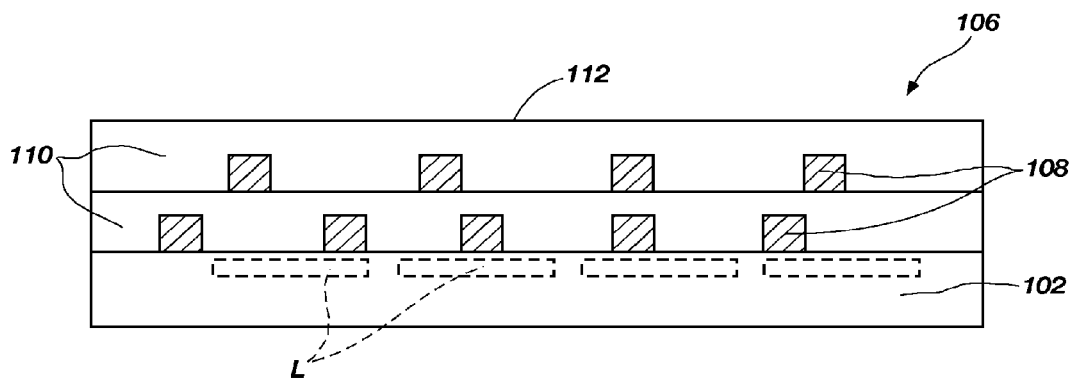
FIGS. 1 through 7b are partial cross-sectional representations of an integrated circuit under fabrication in accordance with embodiments of the present invention.

The present invention includes embodiments of integrated circuits having capacitor-less DRAM cells and logic devices formed on a common substrate and methods for fabricating such integrated circuits. Such methods include the fabrication of a logic device on the active surface of a substrate, formation of an intermediate semiconductor substrate over the surface of the logic device, and fabrication of a capacitor-less DRAM cell on the intermediate semiconductor substrate above the logic device.

The following description provides specific details, such as material types and processing conditions in order to provide a thorough description of embodiments of the present invention. However, a person of ordinary skill in the art will understand that the embodiments of the present invention may be practiced without employing these specific details and in conjunction with conventional fabrication techniques employed in the industry. In addition, the description provided herein does not form a complete process flow for manufacturing a logic device or a capacitor-less DRAM cell, and the integrated circuit described below does not form a complete semiconductor device. Only those process acts and structures necessary to understand the embodiments of the present invention are described in detail below. Additional acts to form a complete semiconductor device including the integrated circuit according to an embodiment of the invention may be performed by conventional techniques.

The materials described herein may be formed by any suitable technique including, but not limited to, spin coating, blanket coating, chemical vapor deposition ("CVD"), plasma enhanced chemical vapor deposition ("PECVD"), atomic layer deposition ("ALD"), plasma enhanced ALD, or physical vapor deposition ("PVD"). Alternatively, materials may be grown in situ. A technique suitable for depositing or growing a particular material may be selected by a person of ordinary skill in the art. While the materials described and illustrated herein may be formed as layers, the materials are not limited thereto and may be formed in other three-dimensional configurations.

In the following detailed description, reference is made to the accompanying drawings, which form a part hereof, and in which is shown, by way of illustration, specific embodiments in which the invention may be practiced. These embodiments are described in sufficient detail to enable a person of ordinary skill in the art to practice the invention. However, other embodiments may be utilized, and structural, logical, and electrical changes may be made without departing from the scope of the invention. The illustrations presented herein are not meant to be actual views of any particular system, logic device, capacitor-less memory cell, or semiconductor device but are merely idealized representations which are employed to describe the present invention. The drawings presented herein are not necessarily drawn to scale. Additionally, elements common between drawings may retain the same numerical designation.

FIGS. 1 through 7b represent partial cross-sectional views of an integrated circuit under fabrication in accordance with embodiments of the present invention. With reference to FIG. 1, an embodiment of a portion of an at least partially fabricated, or intermediate, logic device 106 is illustrated. Logic devices are well known in the art, so the structural details of logic gates are omitted herein for clarity. A simplified partially constructed logic device 106 is illustrated in FIG. 1. The logic device 106 includes a substrate 102 upon which the logic device 106 is formed. The substrate 102 comprises a fabrication substrate, such as a full or partial wafer of semiconductor material (e.g., silicon, gallium arsenide, indium phosphide, etc), a full or partial silicon-on-insulator (SOI) type substrate, such as a silicon-on-glass (SOG), silicon-on-ceramic (SOC), or silicon-on-sapphire (SOS) substrate, or any other known, suitable fabrication substrate. As used herein, the term "wafer" includes conventional wafers as well as other bulk semiconductor substrates. The logic device 106 may be completely fabricated or the logic device 106 may be partially fabricated. Partially fabricated logic device 106 may, as shown (not to scale), include logic L, shown schematically in broken lines, and levels of metal wiring (two depicted) in the form of traces 108 comprising, for example, copper or aluminum wiring surrounded by a dielectric material 110 comprising, by way of non-limiting example, silicon dioxide, borophosphosilicate glass (BPSG), borosilicate glass (BSG), phosphosilicate glass (PSG) or the like. Logic device 106 has an upper or outer surface 112. Because the logic device 106 includes metal traces 108, all subsequent processing acts should be conducted at a temperature at or below about 400° C., so as to avoid thermal damage.

After the foregoing logic device 106 has been fabricated by employing conventional techniques, an intermediate semiconductor substrate, which may comprise silicon, may be formed over the surface of the logic device 106. As a non-limiting example, the intermediate semiconductor substrate may be formed by a process described herein using a modification of so-called SMART-CUT® technology. Such processes are described in detail in, for example, U.S. Pat. No. RE 39,484 to Bruel, U.S. Pat. No. 6,303,468 to Aspar et al., U.S. Pat. No. 6,335,258 to Aspar et al., U.S. Pat. No. 6,756,286 to Moriceau et al., U.S. Pat. No. 6,809,044 to Aspar et al., U.S. Pat. No. 6,946,365 to Aspar et al., and U.S. Patent Application Publication No. 2006/0099776 to Dupont. However, other processes suitable for manufacturing a semiconductor material on the surface of a logic device may also be used, if sufficiently low processes temperatures are maintained. In conventional implementation of SMART-CUT® technology, donor and acceptor wafers are bonded together using a high temperature anneal, on the order of about 1000° C. to about 1300° C. However, the logic device 106 (FIG. 1), due to the presence of metal wiring in the form of traces 108, is unable to withstand exposure to such conventional, high temperature annealing used for wafer bonding without thermal damage. Accordingly, an additional plasma activation act may be integrated into a conventional SMART-CUT® technology fabrication process to lower a required bonding temperature, as described in detail below.

Figure 2:
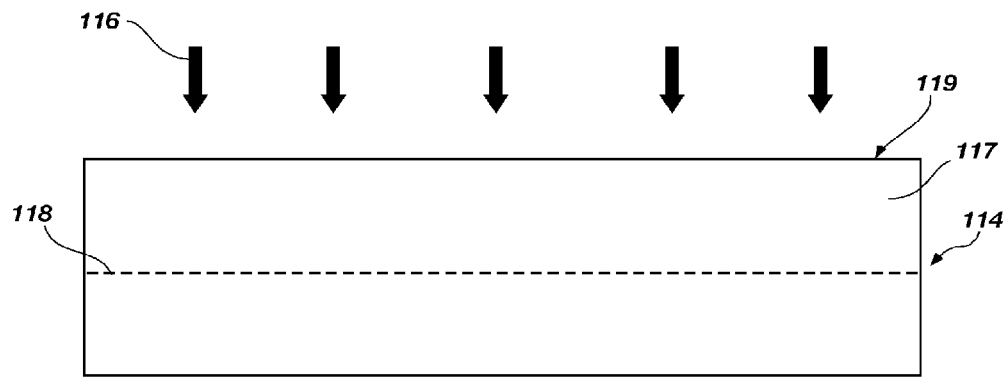

FIG. 2 illustrates a donor wafer 114 comprising, for example, a silicon substrate. The donor wafer 114 has an attachment surface 119 which is implanted, as described in the disclosures of the patent documents in the preceding paragraph, with an atomic species 116, such as hydrogen ions, ions of rare gases, also termed inert or noble gases, or ions of fluorine, with a dose and energy to create an implanted zone 117, which may also be characterized as a transfer region, the inner boundary 118 of which is shown in the donor wafer 114. The inner boundary 118 of implanted zone 117 lies substantially parallel to the attachment surface 119 of the silicon donor wafer 114 and is at a predetermined depth which is dependent on selected parameters of the atomic species implant process, as is well known to one of ordinary skill in the art. The inner boundary comprises a layer of microbubbles or microcavities comprising the implanted species, and provides a weakened structure within donor wafer 114. The donor wafer 114 is then thermally treated at a temperature above that at which implantation is effected, in accordance with the disclosures of the patent documents in the preceding paragraph, to effect crystalline rearrangement in the wafer and coalescence of the microbubbles or microcavities.

Figure 3:
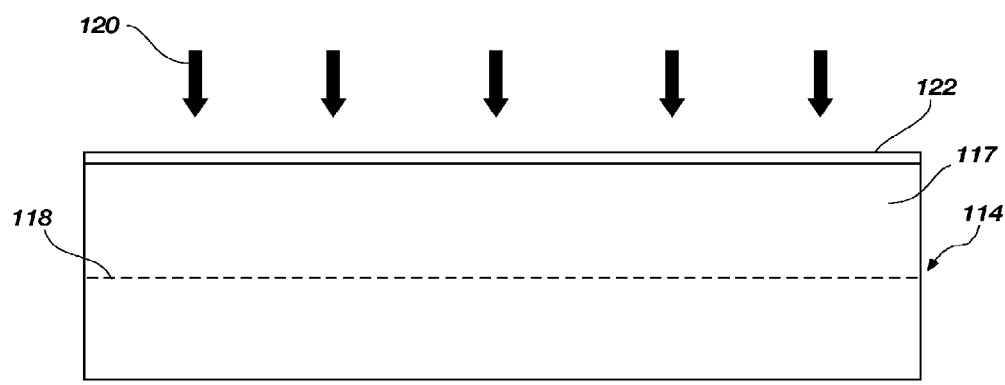

As shown in FIG. 3, the attachment surface 119 of the donor wafer 114 is then exposed to a plasma 120 to form a plasma-activated silicon material 122. The plasma 120 may comprise, for example, argon, argon and oxygen, argon and hydrogen, hydrogen, hydrogen and oxygen, nitrogen, ammonia (NH$_4$) and hydrogen/helium. The plasma-activated silicon material surface, if a hydrogen plasma is employed, exhibits a large number of dangling silicon-hydrogen bonds. The plasma-activated silicon surface increases the kinetics of a subsequent bonding act in the form of an oxide reaction with adjacent material of the substrate 102 bearing logic device 106 (FIG. 1) due to the increased mobility of the ionic species (for example, hydrogen) created on the attachment surface 119 of the donor wafer 114. Plasma-activated bonding is described in U.S. Pat. No. 6,180,496 to Farrens et al., assigned to Silicon Genesis Corporation.

Figure 4:
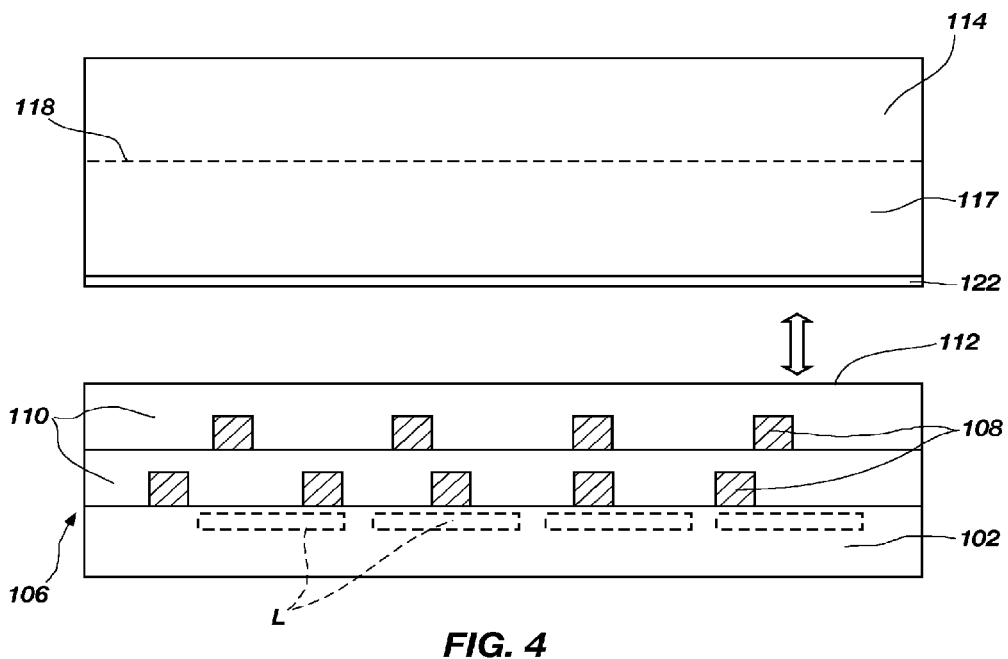

As shown in FIG. 4, the plasma-treated silicon donor wafer 114 is superposed onto the upper surface 112 of the logic device 106 with the plasma-activated silicon material 122 in contact with the upper surface 112 of the logic device 106.

Figure 5:
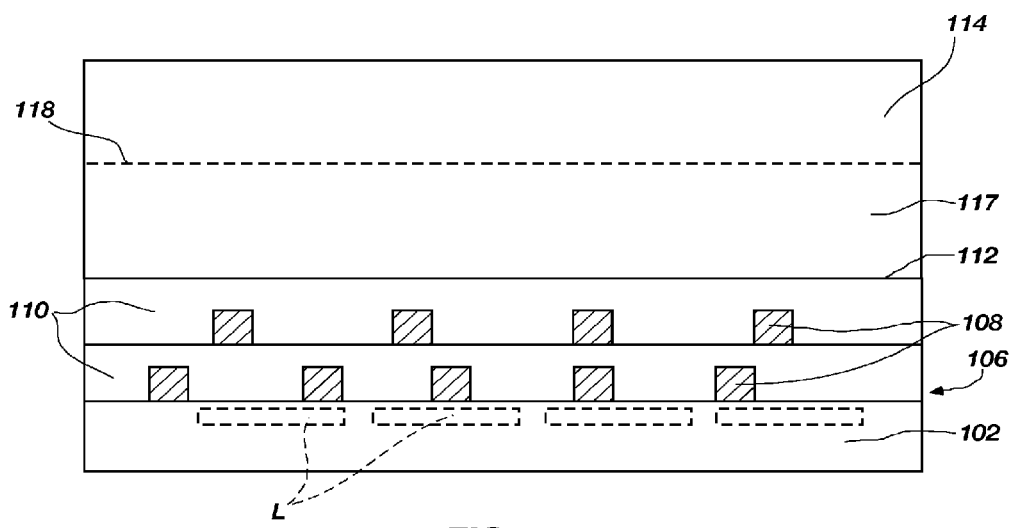

As shown in FIG. 5 the plasma-activated silicon material 122 on the donor wafer 114 is bonded to the upper surface 112 of the dielectric material 110 of logic device 106 by heating the assembly to a temperature of approximately 400° C. or less. Because the attachment surface 119 of the donor wafer 114 was exposed to the plasma 120 (FIG. 3) to form a plasma-activated silicon material, the donor wafer 114 may be bonded to the dielectric material 110 of logic device 106 at a temperature substantially lower than would be otherwise required using a conventional wafer bonding process. As noted above, plasma surface activation prior to bonding increases the kinetics of an oxide reaction initiated between the donor wafer 114 and the dielectric material 110 of the logic device 106 due to the increased mobility of the ionic species created on the surface of the donor wafer 114. As a consequence, the donor wafer 114 is bonded to the logic device 106 at a lower temperature than is possible using conventional techniques.

Figure 6:
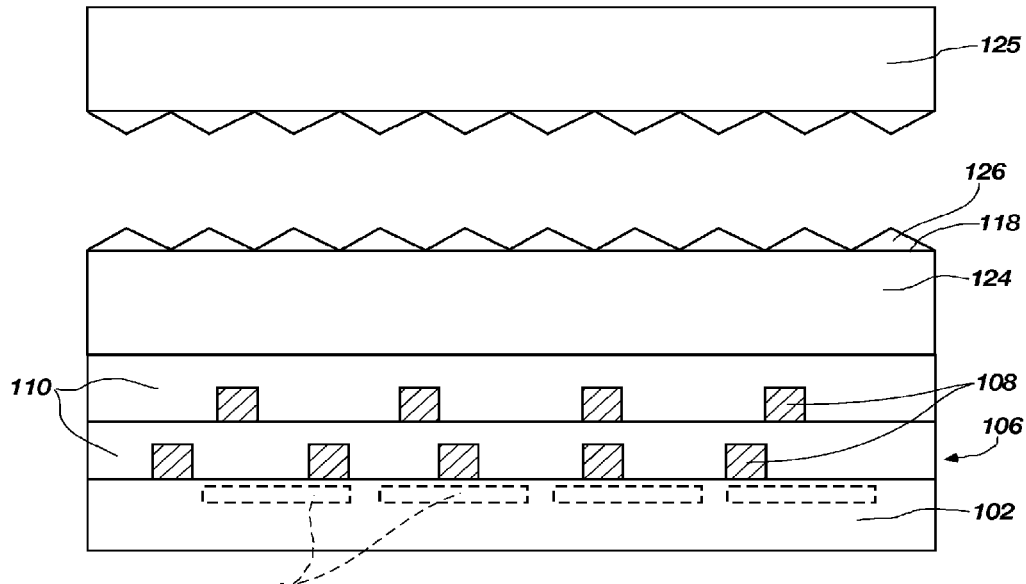

As shown in FIG. 6, the portion of the donor wafer 114 above (as the drawing figure is oriented) the boundary 118 of implanted zone 117 is cleaved by applying a shearing force to the donor wafer 114, forming a detached donor wafer portion 125 and an intermediate silicon substrate 124. The hydrogen or other ions implanted in implanted zone 117 to the depth of inner boundary 118 makes the silicon in the thermally treated donor wafer 114 susceptible to breakage along inner boundary 118 when a shear force is applied. The portion of the donor wafer 114 below the inner boundary 118, of a thickness, for example, of about 50 to about 200 nanometers (about 500 Å to about 2000 Å), remains bonded to the logic device 106 to become an intermediate silicon substrate 124. The surface 126 of the intermediate silicon substrate 124 exposed after cleavage of the detached donor wafer portion 125 may be undesirably rough and jagged. To remedy this deficiency, the exposed surface 126 of the intermediate silicon substrate 124 may be smoothed to a desired degree in order to facilitate further processing as described below, according to techniques known in the art such as, for example, one or more of grinding, wet etching, and chemical-mechanical polishing (CMP).

Figure 7A:
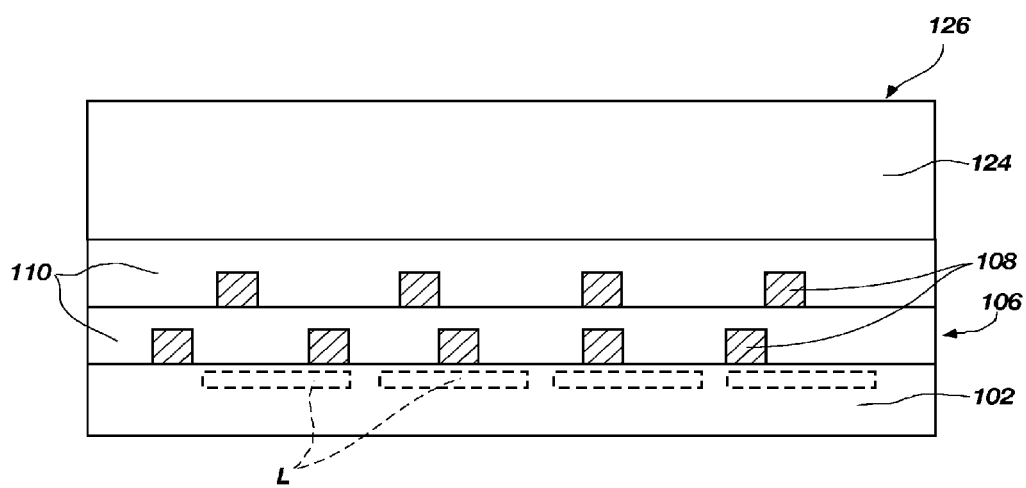

FIG. 7a is an illustration of the logic device 106 with the intermediate silicon substrate 124 after exposed surface 126 has been smoothed. Once the intermediate silicon substrate 124 is bonded and the exposed surface 126 thereof smoothed, then a memory cell may be formed thereon. For example, a capacitor-less DRAM memory cell, also known as a floating body memory cell, may be fabricated on intermediate silicon substrate 124 using conventional low temperature techniques so as not to adversely affect the logic device 106 underneath.

Figure 7B:
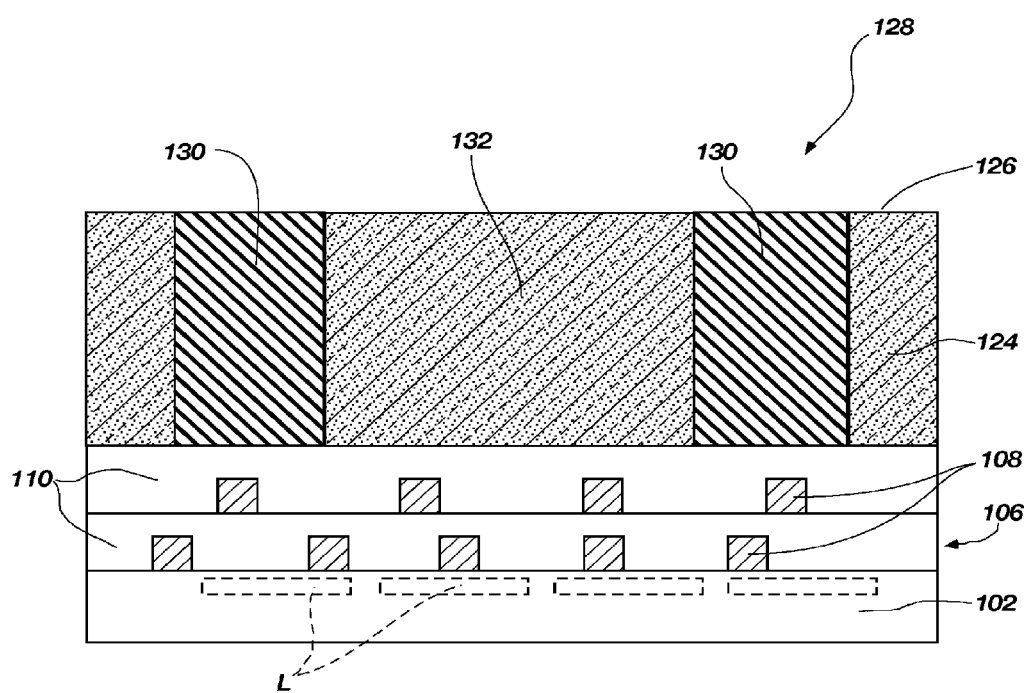

FIG. 7b is an illustration of the fabrication of a capacitor-less DRAM memory cell 128 within the intermediate silicon substrate 124. After the exposed surface 126 is smoothed, intermediate silicon substrate 124 is masked and etched using conventional photolithographic techniques to form apertures surrounding the intended location of DRAM memory cell 128, the apertures then being filled with a $SiO_x$ material suitable for use as an insulator material 130, which may also be termed a dielectric material, such as, for example, SiO or $SiO_2$. Chemical mechanical polishing may be used to remove excess insulator material 130 from the surface 126 of the intermediate silicon substrate.

Figure 8:
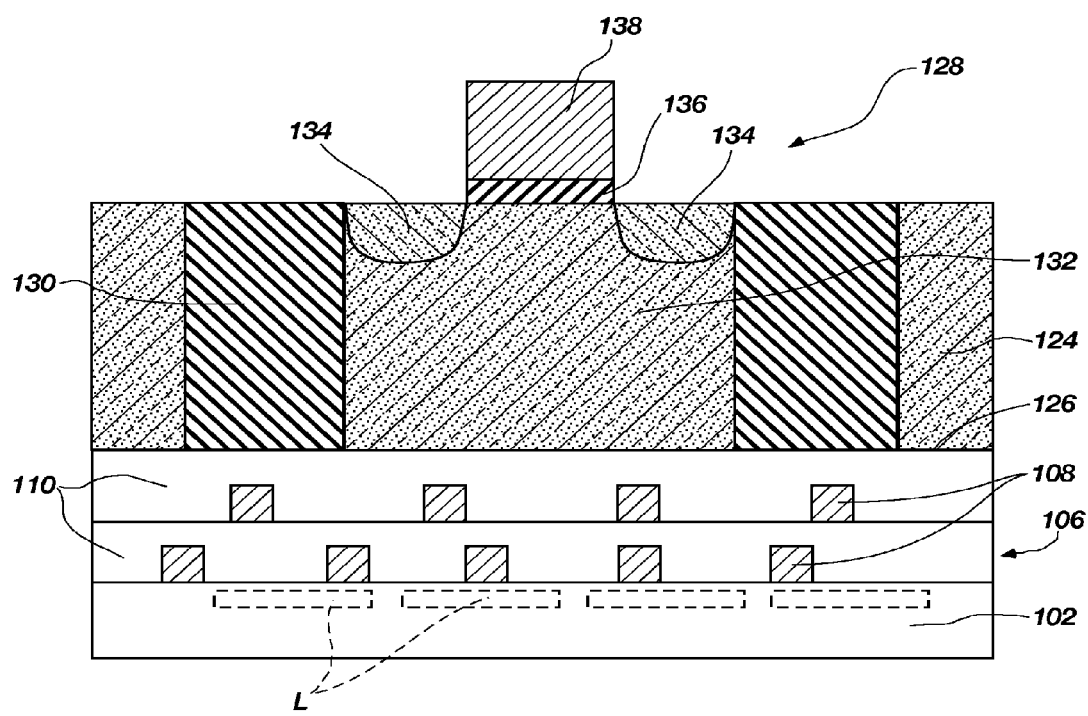
FIG. 8 is a partial cross-sectional representations of an integrated circuit having a logic device and a superposed capacitor-less DRAM memory cell in accordance with embodiments of the present invention.

FIG. 8 illustrates, in an enlarged, simplified cross-sectional view, one embodiment of a capacitor-less DRAM memory cell 128 fabricated within the intermediate silicon substrate 124. It will be understood that, in practice, a plurality of such capacitor-less DRAM cells will be fabricated above logic device 106 in association therewith. Capacitor-less memory cells are known in the art, and each may comprise a one transistor cell, wherein charge is stored in a channel and is refreshed every few milliseconds. As a result, a large number of memory cells may be fabricated over a relatively small area on a substrate in comparison to the area consumed with conventional DRAM cells requiring a dedicated capacitor structure. The capacitor-less memory cell 128 includes an active region 132 surrounded on the sides by the insulator material 130. The active region 132 may be formed from the monocrystalline silicon of the intermediate silicon substrate 124. The entire depth of the intermediate silicon substrate 124 may be used to form the capacitor-less memory cell 128 as shown in FIG. 8, the underlying dielectric material 110 on substrate 102 electrically isolating active region 132 from below.

As shown in FIG. 8, high-k material for gate dielectric 136 is formed on the location for active region 132. The material for gate dielectric 136 has a dielectric constant that is greater than that of silicon dioxide. The gate dielectric 136 may be blanket-deposited by ALD techniques, formed of metal that is oxidized by a low temperature (e.g., 400° C. or less) oxidation process, or a combination thereof. Examples of a suitable material for high k gate dielectric 136 include hafnium silicate, zirconium silicate, hafnium dioxide and zirconium dioxide. A metal material for metal gate 138 is formed on the high k gate deposition material 136. The metal gate 138 and underlying gate dielectric 136 may then be defined using conventional photolithographic techniques in combination with suitable etchants, as known to those of ordinary skill in the art.

Source and drain regions 134 may then be formed by doping exposed portions of the active region 132 flanking gate dielectric 136 and metal gate 138. The source and drain regions will be doped differently than the active region. For example, the active region may comprise p-doped silicon while the source and drain regions comprise n-doped silicon. The dopants of the source and drain regions may be activated by using a microwave anneal technique. Microwave anneal techniques are known in the art and may be used in an embodiment of the invention for activating the source and drain regions at a temperature below 400° C. For example, the doped source and drain regions 134 may be activated by exposing those regions to microwave radiation at about 350° C. Additional metal traces (not shown) connecting to memory cell 128 and further fabrication of the logic device 106 may be completed on the assembly after the capacitor-less DRAM memory cell 128 is formed.

Figure 9:
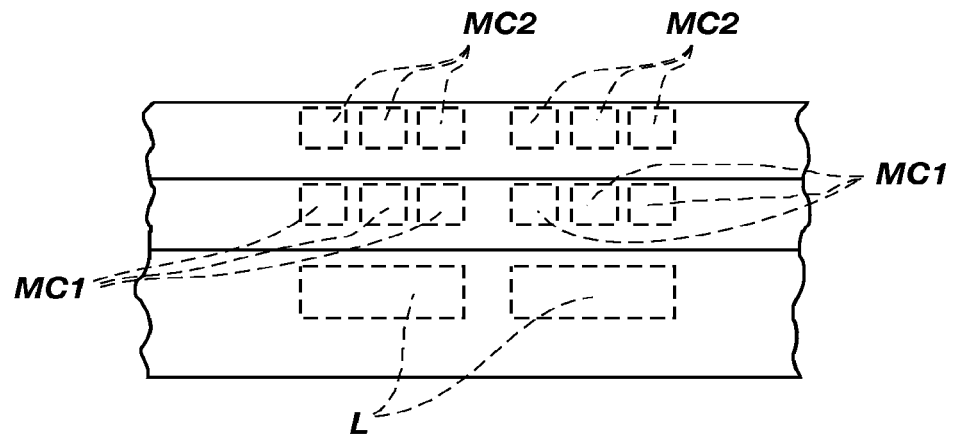
FIG. 9 is a side schematic elevation of a logic device with two levels of superposed capacitor-less DRAM memory cells thereover.
Figure 10:
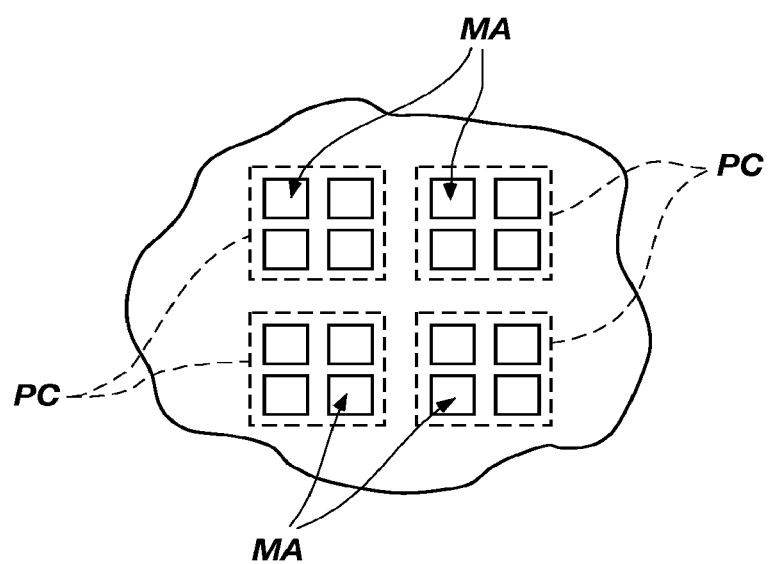
FIG. 10 is a top schematic view of a multi-core processor in accordance with embodiments of the present invention.

In further embodiments, multiple capacitor-less DRAM memory cells may be formed in superimposition over a single logic device. In these embodiments, a dielectric material, such as $SiO_x$ may be formed over a first capacitor-less memory cell and planarized as desired. Another silicon substrate and second capacitor-less memory cell may than be respectively disposed and formed on top of the first capacitor-less memory cell using techniques as described above. Such a structure is schematically illustrated in FIG. 9, wherein logic is designated as L and the two superposed levels of memory cells are respectively designated MC1 and MC2. In further embodiments, a silicon substrate may include multiple logic devices formed thereon, such as a multi-core microprocessor, with each logic device then carrying at least one associated capacitor-less DRAM memory cell thereover. Such a structure is schematically illustrated in FIG. 10, wherein each processor core is designated as PC in broken lines and the superposed groups of memory cells comprising a memory array associated therewith is designated MA.

Fabricating a memory cell on top of a logic device may enable a decreased signal length, on the order of angstroms (for example, within the range of about 100 Å to about 500 Å), from the logic device to the associated, superimposed memory cell. This small signal length, in comparison to the micron-magnitude signal lengths between logic and memory of a conventional processor, may improve signal response time in addition to facilitating fabrication of the integrated circuit. Furthermore, forming the memory cell on top of the logic device may decrease the volume of silicon needed for constructing the integrated circuit. A bare silicon wafer substrate may be about 1000 Å to 5000 Å thick; however, each intermediate silicon layer as employed in embodiments of the invention may be only about 500 Å to 2000 Å thick. Thus, a smaller semiconductor substrate may be used for an array of logic devices. Stated another way, multiple logic device arrays may be formed on the same wafer without requiring additional wafer real estate to carry the associated memory cells.

Although the foregoing description includes many specifics, these are not limiting of the scope of the present invention but, merely, as providing illustrations of some embodiments. Similarly, other embodiments of the invention may be devised which are encompassed within the scope of the present invention. Features from different embodiments may be employed in combination. The scope of the invention is, therefore, indicated and limited only by the appended claims and their legal equivalents, rather than by the foregoing description. All additions, deletions and modifications to the invention as disclosed herein which fall within the meaning and scope of the claims are to be embraced thereby.

What is claimed is:

1. A method for fabricating an integrated circuit, comprising:
    fabricating a wafer to comprise logic circuitry devices, the fabricated wafer having an outer surface;
    disposing a semiconductor material onto the outer surface of the wafer elevationally outward of the logic circuitry devices; and
    fabricating at least one capacitor-less memory cell on the semiconductor material elevationally outward of the logic circuitry devices after disposing the semiconductor material onto the outer surface of the wafer elevationally outward of the logic circuitry devices.

2. The method of claim 1, wherein fabricating a wafer to comprise logic circuitry devices comprises fabricating the logic circuitry devices onto a silicon substrate.

3. The method of claim 2, wherein fabricating the wafer to comprise logic circuitry devices comprises forming metal wiring over the silicon substrate.

4. The method of claim 3, further comprising disposing the metal wiring within a dielectric material.

5. The method of claim 1, wherein disposing a semiconductor material onto the outer surface of the wafer comprises:
    implanting ions to a depth into a donor silicon wafer;
    heat treating the donor silicon wafer to a temperature higher than an implant temperature;
    exposing one side of the donor silicon wafer to a plasma;
    bonding the side of the donor silicon wafer exposed to the plasma to the outer surface of the wafer comprising logic; and
    removing silicon material at substantially the depth from an opposing side of the donor silicon wafer.

6. The method of claim 5, wherein exposing the donor silicon wafer to a plasma comprises exposing the donor silicon wafer to a plasma comprising at least one of argon, argon and oxygen, argon and hydrogen, hydrogen, hydrogen and oxygen, nitrogen, ammonia ($NH_4$) and hydrogen/helium.

7. The method of claim 5, wherein bonding the donor silicon wafer to the outer surface of the wafer comprising logic comprises superposing the donor silicon wafer onto the outer surface of the wafer comprising logic and heating to a temperature of approximately about 400° C. or less.

8. The method of claim 5, further comprising smoothing a surface of the donor silicon wafer having the silicon material removed therefrom.

9. The method of claim 1, wherein fabricating at least one capacitor-less memory cell on the semiconductor material comprises:
    forming an active area from a portion of the semiconductor material substantially surrounded on the sides and bottom by an insulator material;
    forming a high k gate dielectric and a metal gate on the active area; and
    forming a source region and a drain region from the active area.

10. The method of claim 9, wherein forming a source region and a drain region from the active area comprises:
    doping the active area in locations for a source region and a drain region;
    activating the dopant in the locations for the source region and the drain region by microwave annealing at a temperature approximately 400° C. or less.

11. The method of claim 10, wherein forming a high k gate dielectric on the active region comprises:
    forming a metal material on the active area;
    oxidizing the metal material at a temperature of approximately 400° C. or less.

12. The method of claim 1, wherein the outer surface is dielectric.

13. The method of claim 1, wherein disposing a semiconductor material onto the outer surface of the wafer comprises bonding a donor wafer to the outer surface.

14. The method of claim 1, wherein the fabricating of the memory cell comprises forming the memory cell to comprise DRAM.

15. The method of claim 1, wherein the fabricating of the memory cell comprises forming the memory cell to comprise a floating body.

16. The method of claim 1, wherein the fabricating of the memory cell comprises forming a transistor gate dielectric and a transistor gate over the semiconductor material, the gate dielectric physically contacting the semiconductor material.

17. The method of claim 1, wherein the fabricating of the memory cell comprises forming a transistor gate over the semiconductor material and source/drain regions in the semiconductor material.

18. The method of claim 1, wherein the outer surface is planar.

19. The method of claim 13 comprising at least one of ion implanting, heat treating, and plasma treating the donor wafer prior to the bonding.

20. The method of claim 19 comprising ion implanting the donor wafer prior to the bonding.

21. The method of claim 19 comprising heat treating the donor wafer prior to the bonding.

22. The method of claim 19 comprising plasma treating the donor wafer prior to the bonding.

23. The method of claim 19 comprising ion implanting, heat treating, and plasma treating the donor wafer prior to the bonding.

24. The method of claim 13, wherein the donor wafer comprises silicon.

25. A method of forming an integrated circuit, comprising:
forming an implanted zone within a donor substrate having a surface to define a transfer region that includes the donor substrate surface;
exposing the donor substrate surface to a plasma;
bonding the donor substrate surface to a logic device substrate;
detaching the donor substrate along an inner boundary of the implanted zone and leaving the transfer region bonded to the logic device substrate; and
fabricating at least one capacitor-less memory cell onto the transfer region after the detaching of the donor substrate.

26. The method of claim 25, wherein fabricating at least one capacitor-less memory cell onto the transfer region comprises:
isolating an active region from a remainder of the transfer region with an insulating region;
forming a gate electrode on the active region with a high k gate dielectric interposed therebetween;
implanting an impurity in locations for a drain and a source in the active region; and
activating the impurity.

27. The method of claim 26, wherein activating the impurity comprises microwave annealing.

28. The method of claim 25, wherein forming an implanted zone in a donor substrate comprises implanting the donor substrate with hydrogen ions to a substantially uniform depth within the donor substrate.

29. The method of claim 25, wherein exposing the donor substrate surface to a plasma further comprises exposing the donor substrate surface to a plasma to provide an activated ionic species on the donor substrate surface.

* * * * *